(12) United States Patent
Koukitu et al.

(10) Patent No.: US 9,691,942 B2
(45) Date of Patent: Jun. 27, 2017

(54) SINGLE-CYSTALLINE ALUMINUM NITRIDE SUBSTRATE AND A MANUFACTURING METHOD THEREOF

(75) Inventors: Akinori Koukitu, Tokyo (JP); Yoshinao Kumagai, Tokyo (JP); Toru Nagashima, Yamaguchi (JP); Yuki Hiraren, Yamaguchi (JP)

(73) Assignees: National University Corporation Tokyo University of Agriculture and Technology, Tokyo (JP); Tokuyama Corporation, Yamaguchi (JP)

( * ) Notice: Subject to any disclaimer, the term of this patent is extended or adjusted under 35 U.S.C. 154(b) by 283 days.

(21) Appl. No.: 14/366,020

(22) PCT Filed: Dec. 22, 2011

(86) PCT No.: PCT/JP2011/079838
§ 371 (c)(1),
(2), (4) Date: Jun. 17, 2014

(87) PCT Pub. No.: WO2013/094058
PCT Pub. Date: Jun. 27, 2013

(65) Prior Publication Data
US 2014/0346638 A1 Nov. 27, 2014

(51) Int. Cl.
C30B 25/02 (2006.01)
H01L 33/34 (2010.01)
C30B 25/08 (2006.01)
H01L 21/02 (2006.01)
C30B 29/40 (2006.01)
H01L 33/00 (2010.01)
C30B 23/00 (2006.01)

(52) U.S. Cl.
CPC .......... H01L 33/343 (2013.01); C30B 25/02 (2013.01); C30B 25/08 (2013.01); C30B 29/403 (2013.01); H01L 21/0254 (2013.01); H01L 33/0054 (2013.01); C30B 23/00 (2013.01)

(58) Field of Classification Search
CPC ....... C30B 29/403; C30B 25/08; C30B 23/00; C30B 25/00; H01L 21/0254
See application file for complete search history.

(56) References Cited

U.S. PATENT DOCUMENTS

| | | | |
|---|---|---|---|
| 8,129,208 B2 | 3/2012 | Koukitu et al. | |
| 8,641,821 B2 | 2/2014 | Katou et al. | |
| 2006/0027896 A1* | 2/2006 | Fujiwara | C30B 25/02 257/615 |
| 2007/0134827 A1* | 6/2007 | Bondokov | C30B 23/00 438/22 |
| 2008/0083970 A1* | 4/2008 | Kamber | C04B 35/581 257/615 |
| 2009/0173951 A1* | 7/2009 | Kikkawa | H01L 21/02378 257/77 |
| 2010/0221539 A1* | 9/2010 | Mizuhara | C30B 23/02 428/402 |
| 2010/0320462 A1* | 12/2010 | Koukitu | C30B 25/02 257/49 |
| 2011/0018104 A1 | 1/2011 | Nagashima et al. | |

FOREIGN PATENT DOCUMENTS

| | | |
|---|---|---|
| EP | 1624095 A2 | 8/2006 |
| JP | 2009-078971 A | 4/2009 |
| JP | 2010010613 A | 1/2010 |
| JP | 2010-042950 A | 2/2010 |
| JP | 2010-089971 A | 4/2010 |
| JP | 2010089971 | 4/2010 |
| JP | 2011151163 A | 8/2011 |
| WO | 2008/096884 A1 | 8/2008 |
| WO | 2009090821 A1 | 7/2009 |
| WO | 2010/122801 A1 | 10/2010 |

OTHER PUBLICATIONS

International Application No. PCT/JP2011/079838, Written Opinion, dated Feb. 21, 2012.
International Application No. PCT/JP2011/079838, Reply to Written Opinion, dated Mar. 12, 2013.
International app. No. PCT/JP2011/079838, Notification of Transmittal of Translation of the International Preliminary Report on Patenability, dated Jun. 26, 2014.
English Abstract of WO 2010/122801.
English Asbtract of JP 2010-089971.
English Abstract of JP 2010-042950.
English Abstract of WO 2008/096884.
English Abstract of JP 2009-078971.
Kumagai, Y., et al., "Investigation of void formation beneath thin AlN layers by decomposition of sapphire substrates for self-separation of thick AlN layers grown by Hvpe," Journal of Crystal Growth, 2010, pp. 2530-2536, No. 310.
Nagashima, T., et al., "High-speed epitaxial growth of AlN above 1200° C by hydride vapor phase epitaxy," Journal of Crystal Growth, 2007, pp. 42-44, No. 300.
Slack, G., et al., "Some effects of oxygen impurities on AlN and GaN," Journal of Crystal Growth, 2002, pp. 287-298, No. 246.
Freitas Jr., J.A., et al., "Donors in hydride-vapor-phase epitaxial GaN," Journal of Crystal Growth, 2002, pp. 307-314, No. 246.
English Abstract of JP 2010089971.
Extended European Search Report dated Jun. 1, 2015.
English Abstract of WO 2009090821.
English Abstract of JP 2011151163.
English Abstract of JP 2010010613.
Bickermann et al., "Point defect content and optical transitions in bulk aluminum nitride crystals", Phys. Status Solidi B 246, 1181-1183 (2009).

* cited by examiner

*Primary Examiner* — Matthew Song
(74) *Attorney, Agent, or Firm* — Cahn & Samuels, LLP

(57) ABSTRACT

The present invention relates to a single-crystalline aluminum nitride wherein a carbon concentration is $1\times10^{14}$ atoms/$cm^3$ or more and less than $3\times10^{17}$ atoms/$cm^3$, a chlorine concentration is $1\times10^{14}$ to $1\times10^{17}$ atoms/$cm^3$, and an absorption coefficient at 265 nm wavelength is 40 $cm^{-1}$ or less.

16 Claims, No Drawings

# SINGLE-CYSTALLINE ALUMINUM NITRIDE SUBSTRATE AND A MANUFACTURING METHOD THEREOF

This application is a U.S. national stage application of PCT/JP2011/079838 filed on 22 Dec. 2011, the entireties of which are incorporated herein by reference.

TECHNICAL FIELD

The present invention relates to a novel single-crystalline aluminum nitride (hereinafter, sometimes referred to as AlN) and a manufacturing method thereof. In particular, it relates to a novel single-crystalline AlN, wherein a concentration of carbon atom included in said single-crystalline AlN is low and an ultraviolet light transparency is excellent, and to a manufacturing method thereof.

BACKGOUND OF THE INVENTION

In order to form a semiconductor device such as an ultraviolet light emitting device, it is required to form a laminated structure including a clad layer, an active layer and the like between n-semiconductor layer electrically connected to n-electrode and p-semiconductor layer electrically connected to p-electrode; and in view of a emission efficiency, it is important that all layers have a high crystallinity, namely, less dislocation or point defects of crystal. With the reason above, the laminated structure is generally formed on a single-crystalline substrate (hereinafter, sometimes referred to as "a freestanding substrate") having a sufficient mechanical strength for self-supporting.

For the freestanding substrate forming the above laminated structure, it is required that the differences in a lattice constant and a thermal expansion coefficient between said freestanding substrate and Al based III nitride single crystal, such as aluminum gallium indium nitride (AlGaInN), for forming the laminated structure are small. And further, a thermal conductivity of the free standing substrate is required to be high to prevent deterioration of the device. Thus, in order to form semiconductor device including AlN, it is advantageous to form the above laminated structure on a single crystalline Al based III nitride substrate as the freestanding substrate.

In case of the laminated structure, it is important that the single crystalline Al based III nitride substrate of the freestanding substrate to transmit light, in order to extract light from an active layer. If said light transmission is not possible, the light will be absorbed to the single crystalline Al based III nitride substrate even when emission efficiency of the semiconductor device structure is high; and as a result, the structure will be an ultraviolet light emitting device having a low emission efficiency.

In particular, the single-crystalline aluminum nitride among the single crystalline Al based III nitride has a bandgap energy of around 6 eV and emits light of a short wavelength in ultraviolet range; and thus, it is expected to be utilized as a base substrate of LED for UV light source or white color light source. In an efficient manner as LED, it is important that the single-crystalline AlN to transmit light of a short wavelength in ultraviolet range; and the higher the transparency, the more useful said light sources as LED is.

Under such circumstance, a method to manufacture the single-crystalline AlN with a high transparency of light of a short wavelength in ultraviolet range has been actively researched. For instance, a method to manufacture the single-crystalline AlN using hydride vapor phase epitaxy method (HVPE method) as shown in Japanese Laid-Open Patent Publication No. 2010-089971 is conventionally known.

In addition, Japanese Laid-Open Patent Publication No. 2009-078971 discloses a method to decrease an absorption number of a single-crystalline nitride semiconductor substrate, namely, to improve transparency of said single-crystalline nitride semiconductor substrate. The publication discloses that the substrate shows an absorption number of 50 $cm^{-1}$ or less within all wavelength from 350 to 780 nm, if a total impurity density is $1\times10^{17}$ $cm^{-3}$ which is an impurity of AlN. Note that, according to said publication, the substrate temperature when growing single crystals is set at a relatively low temperature of 900 to 1100° C. Thus, a concentration of a total impurity can be suppressed, while crystallinity may be lowered.

While UV light having a wavelength of 265 nm is easily absorbed to DNA of bacteria and destroy said DNA. This is useful for the sterilization and thus a practical application thereof is expected. However, even when the absorption number is 50 $cm^{-1}$ or less within all wavelength from 350 to 780 nm, transparency at 300 nm or less, required for the base substrate of LED for a white color light source, particularly 265 nm, was not sufficient; thus, an improvement of said transparency around 265 nm was expected.

Single-crystalline AlN, manufactured by hydride vapor phase epitaxy method (HVPE method), having a relatively high light transparency at 265 nm is known. Light transparency thereof is however around 40% (absorption number at 265 nm is around 120 $cm^{-1}$), which is insufficient (See Journal of Crystal Growth 312, 2530-2536 (2010).

SUMMARY OF INVENTION

Considering above, the present invention is to provide a single-crystalline AlN superior in a transparency of a short wavelength light at 265 nm, which is in UV region, in other words, to provide single-crystalline AlN having a low absorption number at 265 nm. Further, the present invention is to provide a manufacturing method of single-crystalline AlN superior in said UV light transparency.

Present inventors have studied in detail, in order to solve the above problems. Then, they took notice of a kind and a concentration of an impurity atom included in single-crystalline AlN; and studied a light transparency of a single-crystalline AlN in UV range. Then, they have found that the single-crystalline AlN obtained by the growth at a high temperature by HVPE method shows an absorption number of 40 $cm^{-1}$ or less at a short wavelength of 265 nm in UV range, even when a total impurity content is included in a large amount, such as $1\times10^{15}$ to $1\times10^{20}$ atoms/$cm^3$, if carbon concentration is $1\times10^{14}$ atoms/$cm^3$ or more and less than $3\times10^{17}$ atoms/$cm^3$ and chloride concentration is $1\times10^{14}$ to $1\times10^{17}$ atoms/$cm^3$. Namely, the examination of the present inventors revealed that, it is not merely a problem of the total impurity content included in the single-crystalline AlN when considering the impurity content and the light transparency in UV range.

Further examination was progressed, and it was found that a main atom causing a prevention of 265 nm light transparency was carbon atom. In concrete, it was found that single-crystalline AlN excellent in UV light transparency can be obtained by controlling a concentration of chlorine atom in the single-crystalline AlN to be relatively low, but not zero, as well as controlling a carbon concentration in the single-crystalline AlN as low as possible, which lead to a completion of the invention.

Namely, summary of the invention solving the above problem is as follows:

(1) A single-crystalline aluminum nitride, wherein a carbon concentration is $1\times10^{14}$ atoms/cm$^3$ or more to less than $3\times10^{17}$ atoms/cm$^3$, a chlorine concentration is $1\times10^{14}$ to $1\times10^{17}$ atoms/cm$^3$ and an absorption number at 265 nm is 40 cm$^{-1}$ or less.

(2) The single-crystalline aluminum nitride as described in the above (1), wherein a total concentration of carbon, chlorine, boron, silicon and oxygen included in the single-crystalline aluminum nitride is $1\times10^{15}$ to $1\times10^{20}$ atoms/cm$^3$.

(3) The single-crystalline aluminum nitride as described in the above (1) or (2), wherein a full width at half maximum of an X-ray rocking curve for (0002) plane of the single-crystalline aluminum nitride is 3,000 arcsec. or less. (4) The single-crystalline aluminum nitride as described in any one of the above (1) to (3), wherein a peak at 209 nm, which is a band edge emission light of the aluminum nitride can be confirmed by a photo luminescence measurement.

(5) A manufacturing method of the single-crystalline aluminum nitride as described in the above (1) by growing the single-crystalline aluminum nitride on a single crystalline substrate by a hydride vapor phase epitaxy method, wherein; the single-crystalline aluminum nitride is grown on the substrate at a temperature of 1200 ° C. or more to 1700° C. or less; and an exposed surface in the hydride vapor phase epitaxy apparatus, which becomes 1200° C. or more when growing crystals, consists of a component made of a material which does not cause a reduction decomposition or a thermal decomposition at a temperature of 1200° C. or more to 1700° C. or less, or a material which does not generate gas including carbon atoms even when the material causes the reduction decomposition or the thermal decomposition.

(6) The manufacturing method of the single-crystalline aluminum nitride as described in the above (5), wherein the exposed surface in the hydride vapor phase epitaxy apparatus, which becomes 1200° C. or more, is made of at least one kind selected from a group consisting of BN, TaC, W and Mo.

It has been conventionally considered that it is required to decrease an impurity amount included in a single-crystalline AlN extremely low, in order to obtain the single-crystalline AlN superior in a light transparency. However, even if the concentration of total impurities was extremely decreased as shown in Japanese Laid-Open Patent Publication No. 2009-078971, raising the transparency with respect to a light having 300 nm or less wavelength has not succeeded. Further, single-crystalline AlN disclosed in Japanese Laid-Open Patent Publications No. 2010-089971 and No. 2009-078971 are both manufactured by HVPE method; however, there is a difference on a wavelength dependencies of the light transparency.

Given the above facts, the light transparency of the single-crystalline AlN, especially transparency with respect to a light of 300 nm or less, is estimated to be determined by a complex set of factors (e.g. a manufacturing condition, crystallinity reflecting said manufacturing condition, etc.); and the light transparency does not improve by merely lowering a total impurity concentration. An ideal single crystal, which completely does not include impurity (a total impurity amount is zero) and has no defects, is considered to show a light transparency close to a theoretical value; however, it is impossible with the present technique to completely eliminate contamination and defects thereof.

On the contrary, a single-crystalline aluminum nitride (AlN) according to the present invention becomes superior in UV light transparency even when a total impurity concentration is relatively high; the single-crystalline AlN usable for such as LED in UV region can be obtained.

Single-crystalline AlN having such excellent characteristic was obtained due to a foundation that the transparency in a short wavelength area of 300 nm or less deeply depend on a carbon concentration included as an impurity in the single-crystalline AlN, which was obtained by a crystal growth at a temperature of more than 1200° C. or more with HVPE method and shows a good crystallinity and includes a predetermined amount of C and Cl as impurities.

Japanese Laid-Open Patent Publication No. 2009-078971 also obtains the single-crystalline AlN with HVPE method under a condition wherein a total impurity concentration becomes low (naturally, an impurity carbon concentration becomes low). However, in said patent article, a crystal growth was performed at a temperature of 1,100° C. or less. Thus, with an influence of the crystallinity or the other impurity atoms, the light transparency with respect to light having a wavelength of 300 nm or less could not be improved even when a carbon concentration is low.

DETAILED DESCRIPTION OF THE INVENTION

Hereinafter, the present invention will be described in detail (Single-crystalline Aluminum Nitride)

The present invention relates to a single-crystalline aluminum nitride, wherein a carbon concentration is $1\times10^{14}$ atoms/cm$^3$ or more to less than $3\times10^{17}$ atoms/cm$^3$, a chlorine concentration is $1\times10^{14}$ to $1\times10^{17}$ atoms/cm$^3$ and an absorption number at 265 nm is 40 cm$^{-1}$ or less.

The single-crystalline aluminum nitride of the invention can raise a transparency of light having 265 nm wavelength, even when a total impurity concentration is relatively high, if concentrations of carbon atom and chlorine atom included as impurities are within predetermined ranges.

Several examples other than Japanese Laid-Open Patent Publication No. 2009-078971 were reported (e.g. Physica Status Solidi B246, No. 6, 1181-1183 (2009)), in which an oxygen atom included as an impurity was considered to lower light transparency; carbon was not much directed an attention as a causative material for lowering the light transparency. However, according to the examination of the present inventors considering AlN, grown at a high temperature by HVPE method, it became obvious that UV light transparency in the wavelength range deteriorates when a large amount of carbon impurity, among all the impurities, is included.

The reason for single-crystalline AlN of the present invention to show superior transparency to light having 265 nm wavelength is uncertain; the present inventors presume the following. In single-crystalline AlN particularly superior in crystallinity, N vacancy, generates when a carbon impurity is mixed in single-crystalline AlN, was considered to be a cause for a deterioration of UV light transparency, as described below. Thus, an electrically neutralizing process of chlorine atom, which is inevitably mixed with HVPE method, in addition to a decrease of carbon impurity concentration, inhibit a formation of said N vacancy and improves UV light transparency.

Note, the reason for the low UV light transparency in Japanese Laid-Open Patent Publication No. 2009-078971 is considered that the above mechanism did not effectively function since AlN crystallinity tends to be low and a chlorine concentration included as an impurity tends to be low due to a low growth temperature.

Hereinafter, the current mechanism will be described in detail.

Carbon atom is considered to be introduced to a nitrogen site of AlN, when carbon atom is mixed to single-crystalline AlN as an impurity. The carbon atom has one less outermost shell electrons when compared with nitrogen atom, and thus, a positive electric charge of carbon substituting nitrogen lattice site of AlN becomes excessive. The positive electric charge is treated as a hole in a semiconductor field; however, impurities causing such lack of electrons are generally called acceptor impurities. In case when such acceptor impurities are included, a charge balance in crystals is positively electrified as a whole and becomes an electrically unstable state; thus, in order to deny such positive electric charge, the other defectives having negative electric charge generate. The possible defective which may generate in single-crystalline AlN is a nitrogen hole (N vacancy). N vacancy is a lack of nitrogen atom, originally placed in AlN nitrogen lattice site; N vacancy has a negative electric charge. As described above, in case when carbon atom is mixed as an impurity, electric charges are compensated each other by generating N vacancy, which is considered to maintain an electrical neutrality in single-crystalline AlN.

According to an examination of the present inventors, it became obvious that UV light transparency property in said wavelength region deteriorates when impurities, particularly a large amount of carbon impurity is included. Thus, the present inventors assume that N vacancies, generated when a carbon impurity is mixed in single-crystalline AlN, deteriorate UV light transparency property.

In addition, a chlorine impurity is considered to be mixed in single-crystalline AlN through an aluminum atom included halogen gas, which is a raw material gas to grow said single-crystalline AlN. Growth conditions or a flow current in HVPE apparatus influence a concentration of chlorine impurity, taken into such single-crystalline AlN; the concentration of chlorine impurity tends to rise when a temperature of growing single-crystalline AlN becomes high. However, as mentioned above, UV light transparency can be maintained even when the concentration of chlorine impurity increases by controlling the carbon impurity. A conventional growing method of single-crystalline AlN, such as a sublimation method, does not use a halogenated gas as the raw material gas. Thus, halogen is not mixed theoretically, and a mix of chlorine impurity is a particular characteristic of single-crystalline AlN grown by a hydride vapor phase epitaxy method.

Further, in case when the chlorine atom is mixed in the single-crystalline AlN as an impurity, said chlorine atom is considered to be placed at AlN nitrogen site or in the interstitial site. The chlorine atom has two more outermost shell electrons when compared with nitrogen atom, and thus, a negative electric charge of chlorine substituting AlN nitrogen lattice site becomes excessive. Even when said chlorine atom exist in the interstitial site, said negative electric charge in AlN crystal is considered to be excessive due to an existence of the chlorine atom. Positive electric charge of carbon atom substituted with AlN nitrogen site is excessive; thus, negative electric charge of chlorine atom balances positive electric charge of carbon atom. As a result, it is thought that a generation of the nitrogen hole considered to be induced by the carbon atom is considered to be prevented.

Considering above, by making a mixture of such as carbon or chlorine impurities in a certain range, N vacancy generated by a mixture of the carbon impurity is considered to be reduced. As a result, the present inventors assume that UV light transparency of single-crystalline AlN becomes good.

Thus, in single-crystalline AlN of the invention, carbon and chlorine concentrations must satisfy the above ranges. Among all, in order to show a productivity, a superior light transparency, crystallinity of the single-crystalline AlN, carbon and chlorine concentrations are preferably $1 \times 10^{14}$ atoms/cm$^3$ or more to less than $3 \times 10^{17}$ atoms/cm$^3$ (a carbon concentration) and $1 \times 10^{14}$ to $1 \times 10^{17}$ atoms/cm$^3$ (a chlorine concentration) each, and more preferably $5 \times 10^{14}$ to $1 \times 10^{17}$ atoms/cm$^3$ (a carbon concentration) and $5 \times 10^{14}$ to $5 \times 10^{16}$ atoms/cm$^3$ (a chlorine concentration) each. Further, $1 \times 10^{15}$ to $1 \times 10^{17}$ atoms/cm$^3$ (a carbon concentration) and $1 \times 10^{15}$ to $1 \times 10^{16}$ atoms/cm$^3$ (a chlorine concentration) each is more preferable.

Note, it is difficult to set the carbon concentration to less than $1 \times 10^{14}$ atoms/cm$^3$. However, a bad influence of a chlorine impurity is concerned when a carbon concentration is decreased beyond such lower limit.

In the present invention, a total concentration of carbon, chlorine, boron, silicon and oxygen is preferably $1 \times 10^{15}$ to $1 \times 10^{20}$ atoms/cm$^3$, more preferably $1 \times 10^{16}$ to $5 \times 10^{19}$ atoms/cm$^3$, further preferably $1 \times 10^{17}$ to $1 \times 10^{19}$ atoms/cm$^3$. Among them, concentrations of boron, silicon and oxygen are preferably $1 \times 10^{15}$ to $5 \times 10^{19}$ atoms/cm$^3$, more preferably $1 \times 10^{16}$ to $1 \times 10^{19}$ atoms/cm$^3$, further preferably $5 \times 10^{16}$ to $1 \times 10^{18}$ atoms/cm$^3$ each. These impurities are generally mixed from a crystal growing apparatus component or raw materials for growing single-crystalline AlN. Single-crystalline AlN of the present invention shows a high transparency to a light of 300 nm or less wavelength, e.g. 265 nm wavelength, even when such impurities are included.

By setting impurity concentrations of carbon atom and chlorine atom in single-crystalline AlN as mentioned above, an absorption number at 265 nm wavelength, which is an indicator of UV light transparency, is 40 cm$^{-1}$ or less, further, 30 cm$^{-1}$ or less, and 20 cm$^{-1}$ or less when manufacturing conditions are optimized. The absorption number (unit: cm$^{-1}$) is used for an indicator for determining good and bad of the light transparency. The smaller the absorption number, the superior the light transparency. An absorption number value varies depending on the wavelength; the absorption number at 265 nm wavelength, when used as UV emission diode, is 40 cm$^{-1}$ or less, further 30 cm$^{-1}$ or less, and more preferably 20 cm$^{-1}$ or less. Further, the smaller the absorption number, superior the light transparency; thus, the lower limit is better in small, and there is no limitation for this. However, considering industrial productivity, the lower limit of the absorption number at 265 nm wavelength is 1 cm$^{-1}$. Note, in the present invention, the indicator of UV light transparency is shown by an absorption number at 265 nm wavelength; however, if the absorption number at 265 nm wavelength is a low value, which satisfy the above range; an absorption number at 240 to 300 nm wavelength is naturally low, and the light transparency in this range becomes good.

Here, the absorption number defines a light absorption number a calculated from the result of a linear transparency (T, unit: %) of 265 nm wavelength at a measurement piece of single-crystalline AlN processed to a plate having a thickness (t: unit: cm), by the following equation:

$$\alpha = 2.303/t \times \log_{10}(100/T)$$

Further, in the invention, a full width at half maximum of X-ray rocking curve for (0002) plane of the single-crystalline AlN is preferably 3,000 arcsec. or less, more preferably 1 to 1,500 arcsec., further preferably 5 to 1,000 arcsec. An effect of the invention tends to be difficult to be obtained if a crystallinity lowers.

Generally, it is required to raise the crystal growth temperature if a crystallinity improvement is required; a problem such as an increase of mixture impurities occur when the growth temperature is high. On the other hand, only the carbon and chlorine mixture amounts are required to be controlled in the invention; thus, such superior crystallinity can be easily achieved. Note, in the invention, AlN is a single crystal and thus, a peak due to c plane of AlN such as (0002) and (0004) planes, is observed when X-ray diffraction measurement of θ-2θ mode is performed.

Further, with single-crystalline AlN of the invention, a peak of 209 nm, which is a band edge emission light of AlN, can be observed by a photo luminescence measurement. Namely, an excitation light source using 193 nm ArF laser is irradiated vertically to a sample, and the sample is excited. Further, a luminescence light generated from the sample is collected by a focusing lens, detected by a spectrometer, and a spectrum intensity to a wavelength is obtained. An emission wavelength of the band edge emission light may slightly fluctuate by the impurities included in the single-crystalline AlN; with the single-crystalline AlN of the invention, the band edge emission light is observed within a range of 205 to 215 nm by a measurement at a room temperature (23° C.).

Next, a manufacturing method of single-crystalline AlN of the invention is described. The manufacturing method of single-crystalline AlN of the invention is not particularly limited, if the carbon and chlorine concentrations can be controlled within a predetermined range. For the reason of a good and proper reproducibility of single-crystalline AlN of the invention, it is preferably manufactured as below by hydride vapor phase epitaxy method (HVPE method). Namely, single-crystalline AlN of the invention is preferably manufactured by the following method (a method of the present invention). When growing single-crystalline AlN on a single crystal substrate by HVPE method, single-crystalline AlN is grown on the substrate at a temperature of 1,200° C. or more to 1,700° C. or less; and an exposed surface, which becomes 1,200° C. or more when growing crystals, in hydride vapor phase epitaxy method apparatus consists of a component comprising a material which does not cause a reduction decomposition or a thermal decomposition at a temperature of 1,200° C. or more to 1,700° C. or less, or a material which does not generate gas including carbon atoms even when the material causes the reduction decomposition or the thermal decomposition.

Here, HVPE method is a method to grow AlN by supplying Al source gas and Nitrogen source gas on a heated single crystal substrate. In general, an aluminum trichloride gas is used for said Al source gas and an ammonia gas is used for said Nitrogen source gas. The chlorine concentration in single-crystalline AlN is easily controlled, thus, an aluminum trichloride gas is preferably used for Al source gas.

Further, the single-crystalline substrate is not particularly limited, if it is a single-crystalline AlN substrate with good crystallinity; single-crystalline AlN freestanding substrate obtained by the following method or a composite AlN freestanding substrate, wherein a layer comprising the single-crystalline AlN is laminated on a main layer comprising polycrystal and/or noncrystalline AlN, are preferably used, since the single-crystalline AlN of the invention with good crystallinity can be effectively obtained.

A single-crystalline AlN freestanding substrate can be preferably manufactured by the method disclosed in Japanese Laid-Open Patent Publication No. 2010-89971. In concrete, at first, a seed crystal substrate having the first single-crystalline AlN layer is prepared on a surface, by a method such as to form single-crystalline AlN layer on a single-crystalline substrate of different kinds, such as sapphire or a single-crystalline Si. Next, a laminated body, laminating a layer comprising the above single-crystalline AlN by a vapor-phase growth method on the first single-crystalline AlN layer of said seed crystal substrate, is manufactured; the layer is sometimes referred to as "the second single-crystalline AlN", hereinafter. Subsequently, by separating the second single-crystalline AlN layer (removing said seed crystal substrate) from the laminated body (remove said seed crystal substrate), a single-crystalline AlN freestanding substrate comprising single-crystalline AlN ("the second single-crystalline AlN) can be obtained.

Further, the composite AlN freestanding substrate can be manufactured with the methods described in such as WO2009/090821, Japanese Laid-Open Patent Publication No. 2010-10613, etc.

In concrete, said composite AlN freestanding substrate can be manufactured by forming a single-crystalline AlN thin-film layer on the single-crystalline substrate of different kinds, such as sapphire or single-crystalline Si, forming AlN non-single-crystalline layer comprising polycrystal, non-crystalline or a mixture thereof upon the single-crystalline AlN thin-film layer, and removing the single-crystalline substrate of different kinds.

Note, in case when said composite AlN freestanding substrate is used as a substrate of HVPE method, the single-crystalline AlN thin-layer exposed by removing the single-crystalline substrate of different kinds is used as a crystal growing surface. For said composite AlN freestanding substrate, in view of productivity and crystallinity of the outermost surface, the substrate, wherein a thickness of the single-crystalline AlN thin-film layer forming the outermost surface is 10 nm or more and 1.5 μm or less and a thickness of AlN non-single-crystalline layer is 100 times or more of the single-crystalline AlN thin film layer, is preferably used.

In the invention, in case when growing single-crystalline AlN on the surface of such substrate with HVPE method, a growth temperature (a substrate temperature when growing crystals) is set at 1,200° C. or more to 1,700° C. or less; and an exposed surface range (hereinafter, may be called "a high temperature heating range"), which becomes 1,200° C. or more when growing crystals, in HVPE apparatus consists of a component comprising a material which does not cause a reduction decomposition or a thermal decomposition at a temperature of 1,200° C. or more to 1,700° C. or less, or a material (hereinafter, generally called "a carbon non-generating material") which does not generate carbon atom included gas even when the material causes the reduction decomposition or the thermal decomposition.

In case when a growth temperature is less than 1200° C., not only the chlorine concentration included in the grown single-crystalline AlN becomes out of the range of the chlorine concentration in the single-crystalline AlN of the present invention, but a single-crystalline AlN with high crystallinity becomes difficult to obtain; thus, single-crystalline AlN of the present invention cannot be manufactured with good reproducibility.

Further, in case when an apparatus, wherein a material which generates gas including carbon atoms by the reduction decomposition or the thermal decomposition at a temperature of 1,200° C. or more to 1,700° C. or less is exposed, is used as said HVPE apparatus, it is extremely difficult to set the carbon concentration included in the single-crystalline AlN within a range of the same in the single-crystalline AlN of the present invention.

In detail, HVPE apparatus in present use comprises a high-frequency induction heating apparatus, a suceptor (a substrate support stand) having a rotating mechanism, and etc. in order to grow a single-crystalline AlN with good crystallinity on a substrate uniformly at a high speed. For instance, as a material of a component composing an area, which becomes to have a temperature of 1200° C. or more, graphite or silicon carbide is generally used. In view of preventing carbon, generated from these materials in a large amount, to be mixed in the single-crystalline AlN, a component made of a nitride based ceramic sintered compact or a component, obtained by surface treating graphite and the like with TaC or BN which have an extremely high heating resistance, may be used; the carbon generating amount can be greatly reduced by providing such countermeasure. However, even with such countermeasure, it was difficult to set the carbon concentration to less than $3 \times 10^{17}$ cm$^{-3}$ in good reproducibility.

However, generally, (it may be one of the causes that the carbon influence was not regarded seriously) it was figured that a sufficient effect can be obtained by providing such countermeasure; and even more advanced countermeasures were not taken. Namely, no countermeasure was provided for the followings: a graphite was used for a fine component difficult to process, such as screw; tiny pinholes was existing at a coat layer or carbon, included as impurity in a raw material itself of nitride based ceramic sintered compact (in which binder comprising organic matters is used for manufacturing, and thus, carbon amount, which cannot be ignored as an impurity, may be included.) or so.

The present inventors have thoroughly examined the HVPE apparatus including the above points, and provided a countermeasure wherein an exposed surface of the high temperature heating range in HVPE apparatus is composed only of a carbon non-generating material. As a result, manufacturing single-crystalline AlN of the invention succeeded for the first time. Note when pinholes exist at a coat layer, the substrate material will be exposed on the surface via pinholes. Thus, the existence of pinholes must be thoroughly checked in case when a component of the graphite material surface coated with such as TaC or BN is used; it is necessary to use a component without said pinholes. Further, in case when gas including carbon atoms slightly leaks via a crack after mounting a screw or so, it is required to make said surface to a carbon non-generating material.

As said carbon non-generating material, BN, TaC, W, Mo, Ta and the like may be considered. While as the component generating gas including carbon atom by a reduction decomposition or a thermal decomposition, carbon, carbon with SiC coat layer, BN sintered compact, AlN sintered compact, SiC sintered compact and a carbon with TaC or BN coat layer wherein cracks or pinholes exist on the coat layer can be considered.

Single-crystalline AlN of the invention can be grown under a presence of an appropriate carbon source and chlorine source by adopting the above conditions. Note, a thickness of the layer comprising AlN of the invention obtained by a method of the present invention is not particularly limited, and can be suitably determined according to its use. It is generally 50 μm or more to 2,000 μm or less.

Single-crystalline AlN of the invention can be obtained by separating and removing the substrate from a laminated body manufactured by the above methods. A well-known method can be adopted for separating and removing the substrate. In concrete, a seed crystal substrate can be removed from the laminated body by cutting mechanically and polishing, and the second single-crystalline AlN layer (single-crystalline AlN of the invention) can be obtained.

EXAMPLE

Hereinafter, the present invention will be described in detail using examples and comparative examples referring to the figures; however the present invention is not limited thereto.

Example 1

(Preparation of a Substrate)

In the present invention, a composite AlN freestanding substrate was manufactured as a substrate according to the method described in WO2009/090821. In this composite AlN freestanding substrate, a thickness of single-crystalline AlN thin-film layer, constituting single-crystalline AlN surface, was 230 nm and a thickness of AlN non-single-crystalline layer (poly-crystalline AlN layer) underneath the single-crystalline AlN thin-film layer was 350 μm.

The composite AlN freestanding substrate was washed for 3 min. with supersonic wave of 100 kHz frequency in acetone, and then washed for 3 min. with supersonic wave of 100 kHz frequency in 2-propanol. Subsequently, the substrate was rinsed with ultrapure water, and blew with dry nitrogen to remove the ultrapure water.

(Manufacturing the Single-crystalline AlN of the Invention)

In HVPE apparatus used in the present example, a part which generates gas including carbon atom by a reduction decomposition or a thermal decomposition at 1200° C. or more was eliminated. In concrete, graphite wherein a total surface of suceptor is coated with BN, was used as the suceptor material; BN was used as a rotating shaft of the suceptor and as a heat insulating plate around the suceptor; and a BN coated graphite made screw was used to fix the suceptor and the rotating shaft. Note, a whole peripheral of BN coat layer of the suceptor was observed using a stereo microscope with which observation magnifies within a range of 8 to 56 diameters, and it was confirmed that the coat layer has no pinhole or crack.

First, the composite AlN freestanding substrate was set on a tungsten made suceptor in HVPE apparatus, where single-crystalline AlN surface became the outermost surface; a surface cleaning of said AlN freestanding substrate was then performed by heating to 1450° C. and holding for 10 minutes at a pressure of 150 Torr under a flow of a mixed carrier gas of hydrogen gas (7,000 sccm) and nitrogen gas (3,000 sccm). At this point, 0.5 vol % of ammonia gas with respect to a total carrier gas flow (10,000 sccm) was supplied. Next, 0.05 vol % of aluminum chloride gas, obtained by a reaction of metal aluminum heated to 420° C. and hydrogen chloride gas, with respect to the total carrier gas flow was supplied. This was held for 15 hrs. and 300 μm of single-crystalline AlN layer of the invention was grown on the substrate.

After single-crystalline AlN layer was grown to have said film thickness, supply of aluminum chloride gas was stopped, a kind of carrier gas was changed to nitrogen gas, and cooled to a room temperature. Ammonia gas was continuously supplied until the substrate temperature is decreased to 800° C.

(Grind and Evaluation of the Obtained Single-crystalline AlN Layer)

The composite AlN freestanding substrate used in the present example was supported by poly-crystalline AlN layer having a thickness of 350 μm; however, the poly-crystalline AlN layer comprises many grain boundary faces and thus light scatters and ultraviolet light transparency cannot be obtained. Therefore, in order to evaluate absorption number of the grown single-crystalline AlN layer, composite AlN freestanding substrate was removed by grinding, the surface of the residual single-crystalline AlN layer was grinded, and a sample of single-crystalline AlN, manufactured only by the single-crystalline AlN layer, with a thickness of 200 μm was manufactured. A surface of the sample was performed with a double side mirror surface polishing state to have around 5 nm of RMS value.

Linear transparency at 265 nm wavelength of the sample, evaluated with an ultraviolet visible light spectrophotometer (V-7300 by JASCO Corp.), was 70% and absorption number α (unit: $cm^{-1}$) was 18 $cm^{-1}$. Further, concentrations of oxygen atom and carbon atom were quantitatively analyzed by a secondary ion mass spectrometry (IMS-f6 by CAM-ECA) using a cesium ion of 15 kV accelerating voltage as a primary ion. Quantities of oxygen and carbon atom concentrations of the sample were determined based on a calibration curve using a separately prepared AlN standard sample by measuring a secondary ionic strength at 5 μm deep from the surface side. As a result, the sample showed the carbon atom concentration of $1 \times 10^{17}$ $cm^{-3}$ and the oxygen atom concentration of $3 \times 10^{17}$ $cm^{-3}$. Further, chlorine atom concentration was $1 \times 10^{15}$ $cm^{-3}$, a total concentration of carbon, chlorine, boron, silicon and oxygen in the sample was $5.1 \times 10^{17}$ $cm^{-3}$, and a total concentration of boron, silicon and oxygen was $4.1 \times 10^{17}$ $cm^{-3}$.

A full width at half maximum of an X-ray rocking curve on the plane (0002) of the sample was 1,200 arcsec. Further, only (0002) and (0004) planes of AlN were observed when performing X-ray diffraction measurement of θ-2θ mode.

Further, a photo luminescence measurement at room temperature (23° C.) was measured. HT800UV (laser light source: ExciStarS-200) by Horiba Ltd. was used as a measurement apparatus. ArF laser of 193 nm as an excitation light source was vertically irradiated to the sample, and the sample was excited. Luminescence light generated from the sample was collected by condensing lens; and then spectrum with respect to the wavelength was detected with spectrometer. An irradiation time was 10 sec., an integration time was 3 times, a hole diameter was 1,000 μm and a grating was 300 grooves/mm. As a result, a peak around 209 nm, which is a band edge emission light of AlN, was able to be confirmed.

Example 2

Single-crystalline AlN layer was grown by the same procedure with Example 1, except using a tungsten screw for fixing a suceptor of HVPE apparatus and a rotating shaft, and setting a temperature when growing single-crystalline AlN layer of the invention to 1350° C.

By performing a mirror surface polish on both sides, a sample having 200 μm thickness made only by the grown single-crystalline AlN layer was manufactured; and a linear transparency at 265 nm, a concentration of impurity, a full width at half maximum of an X-ray rocking curve for (0002) plane, an X-ray diffraction profile of θ-2θ mode and photoluminescence spectrum were measured by the same method with Example 1. As a result, the linear transparency was 58% and the absorption number was calculated to 27 $cm^{-1}$. The concentration of carbon atom was $3 \times 10^{16}$ $cm^{-3}$ and the concentration of oxygen atom was $5 \times 10^{17}$ $cm^{-3}$. Further, chlorine atom concentration was $5 \times 10^{15}$ $cm^{-3}$, a total concentration of carbon, chlorine, boron, silicon and oxygen in the sample was $8.4 \times 10^{17}$ $cm^{-3}$, and a total concentration of boron, silicon and oxygen was $8.0 \times 10^{17}$ $cm^{-3}$.

A full width at half maximum of an X-ray rocking curve for (0002) plane of the sample was 1,800 arcsec. Further, only (0002) and (0004) planes of AlN were observed when performing an X-ray diffraction measurement of θ-2θ mode. Further, a photo luminescence measurement at a room temperature (23° C.) was performed; and as a result, a peak around 209 nm, which is a band edge emission light of AlN, was confirmed.

Example 3

Single-crystalline AlN layer was grown by the same procedure with Example 1, except using TaC made screw for fixing the suceptor of HVPE apparatus and a rotating shaft, and setting a temperature when growing single-crystalline AlN layer of the invention to 1250° C.

By performing a mirror surface polish on both sides, a sample having 200 μm thickness made only by the grown single-crystalline AlN layer was manufactured; and the linear transparency at 265 nm, the concentration of impurity, the full width at half maximum of an X-ray rocking curve for (0002) plane, the X-ray diffraction profile of θ-2θ mode and the photoluminescence spectrum were measured by the same method with Example 1. As a result, the linear transparency was 45% and the absorption number was calculated to 40 $cm^{-1}$. The concentration of carbon atom was $3 \times 10^{16}$ $cm^{-3}$ and the concentration of oxygen atom was $1 \times 10^{17}$ $cm^{-3}$. Further, the chlorine atom concentration was $7 \times 10^{14}$ $cm^{-3}$, the total concentration of carbon, chlorine, boron, silicon and oxygen in the sample was $5.3 \times 10^{17}$ $cm^{-3}$, and a total concentration of boron, silicon and oxygen was $5.0 \times 10^{17}$ $cm^{-3}$.

The full width at half maximum of the X-ray rocking curve for (0002) plane of the sample was 2,800 arcsec. Further, only (0002) and (0004) planes of AlN were observed when performing the X-ray diffraction measurement of θ-2θ mode. Further, the photo luminescence measurement at room temperature (23° C.) was performed; and as a result, a peak around 209 nm, which is the band edge emission light of AlN, was confirmed.

Comparative Example 1

Single-crystalline AlN layer was grown by the same procedure with Example 1, except using graphite screw for fixing the suceptor of HVPE apparatus and the rotating shaft, and setting a temperature when growing single-crystalline AlN layer of the invention to 1550° C.

By performing a mirror surface polish on both sides, a sample having 200 μm thickness made only by the grown single-crystalline AlN layer was manufactured; and the linear transparency at 265 nm, the concentration of impurity, the full width at half maximum of an X-ray rocking curve for (0002) plane, the X-ray diffraction profile of θ-2θ mode and the photoluminescence spectrum were measured by the same method with Example 1. As a result, the linear transparency was 38% and the absorption number was calculated to 48 $cm^{-1}$. The concentration of carbon atom was $7 \times 10^{17}$ $cm^{-3}$ and the concentration of oxygen atom was $5 \times 10^{16}$ $cm^{-3}$. Further, chlorine atom concentration was $4 \times 10^{14}$ $cm^{-3}$, the total concentration of carbon, chlorine, boron, silicon and oxygen in the sample was $1.1 \times 10^{18}$ $cm^{-3}$, and the total concentration of boron, silicon and oxygen was $3.5 \times 10^{17}$ $cm^{-3}$.

The full width at half maximum of an X-ray rocking curve for (0002) plane of the sample was 1,000 arcsec. Further, only (0002) and (0004) planes of AlN were observed when performing the X-ray diffraction measurement of θ-2θ mode. Further, the photo luminescence measurement at room temperature (23° C.) was performed; and as a result, a peak around 209 nm, which is a band edge emission light of AlN, was confirmed.

Comparative Example 2

Single-crystalline AlN layer was grown by the same procedure with Example 1, except using graphite, wherein a total surface of suceptor is coated with BN, as suceptor material of HVPE apparatus; and using graphite for a screw fixing the suceptor and a rotating shaft. Note, a whole peripheral of BN coat layer of the present suceptor used in the comparative example was observed using a stereo microscope with which observation magnifies within a range of 8 to 56 diameters; and it was confirmed that there are few pinholes of around 1 mm diameter, and graphite, which is a substrate of suceptor, is exposed at said pinholes.

By performing a mirror surface polish on both sides, a sample of 200 μm thickness made only by the grown single-crystalline AlN layer was manufactured; and the linear transparency at 265 nm, the concentration of impurity, the full width at half maximum of an X-ray rocking curve for (0002) plane, the X-ray diffraction profile of θ-2θ mode and the photoluminescence spectrum were measured by the same method with Example 1. As a result, the linear transparency was 17% and the absorption number was calculated to 90 $cm^{-1}$. The concentration of carbon atom was $4×10^{18}$ $cm^{-3}$ and the concentration of oxygen atom was $5×10^{16}$ $cm^{-3}$. Further, chlorine atom concentration was $4×10^{15}$ $cm^{-3}$, the total concentration of carbon, chlorine, boron, silicon and oxygen in the sample was $4.1×10^{18}$ $cm^{-3}$, and the total concentration of boron, silicon and oxygen was $9.1×10^{16}$ $cm^{-3}$.

The full width at half maximum of an X-ray rocking curve for (0002) plane of the sample was 1,250 arcsec. Further, only (0002) and (0004) planes of AlN were observed when performing the X-ray diffraction measurement of θ-2θ mode. Further, the photo luminescence measurement at room temperature (23° C.) was performed; and as a result, a peak around 209 nm, which is the band edge emission light of AlN, was confirmed.

Comparative Example 3

Single-crystalline AlN layer was grown by the same procedure with Example 1, except using SiC as the suceptor material of HVPE apparatus, using TaC for a screw fixing the suceptor and the rotating shaft, and determining a thickness of the growing AlN layer to be 150 μm.

By performing the mirror surface polish on both sides, a sample having 150 μm thickness made only by the grown single-crystalline AlN layer was manufactured; and the linear transparency at 265 nm, the concentration of impurity, the full width at half maximum of an X-ray rocking curve for (0002) plane, the X-ray diffraction profile of θ-2θ mode and the photoluminescence spectrum were measured by the same method with Example 1. As a result, the linear transparency was 0.1% and the absorption number was calculated to 435 $cm^{-1}$. The concentration of carbon atom was $1×10^{19}$ $cm^{-3}$ and the concentration of oxygen atom was $5×10^{17}$ $cm^{-3}$. Further, the chlorine atom concentration was $8×10^{14}$ $cm^{-3}$, the total concentration of carbon, chlorine, boron, silicon and oxygen in the sample was $1.1×10^{19}$ $cm^{-3}$, and the total concentration of boron, silicon and oxygen was $1.0×10^{18}$ $cm^{-3}$.

The full width at half maximum of the X-ray rocking curve for (0002) plane of the sample was 2,500 arcsec. Further, only (0002) and (0004) planes of AlN were observed when performing the X-ray diffraction measurement of θ-2θ mode. Further, the photo luminescence measurement at room temperature (23° C.) was performed; and as a result, a peak around 209 nm, which is the band edge emission light of AlN, was confirmed.

Comparative Example 4

Single-crystalline AlN layer was grown by the same procedure with Example 1, except using graphite as the suceptor material of HVPE apparatus, setting the sapphire substrate to surround the total peripheral of the substrate as an oxygen source, using graphite for a screw fixing the suceptor and the rotating shaft, and setting the growth temperature to 1490° C.

By performing a mirror surface polish on both sides, a sample having 200 μm thickness made only by the grown single-crystalline AlN layer was manufactured; and the linear transparency at 265 nm, the concentration of impurity, the full width at half maximum of an X-ray rocking curve for (0002) plane, the X-ray diffraction profile of θ-2θ mode and photoluminescence spectrum were measured by the same method with Example 1. As a result, the linear transparency was 6% and the absorption number was calculated to 141 $cm^{-1}$. The concentration of carbon atom was $6×10^{17}$ $cm^{-3}$ and the concentration of oxygen atom was $2×10^{20}$ $cm^{-3}$. Further, the chlorine atom concentration was $8×10^{16}$ $cm^{-3}$, the total concentration of carbon, chlorine, boron, silicon and oxygen in the sample was $2.1×10^{20}$ $cm^{-3}$, and the total concentration of boron, silicon and oxygen in this AlN freestanding substrate was $2.1×10^{20}$ $cm^{-3}$.

The full width at half maximum of an X-ray rocking curve for (0002) plane of the sample was 5,300 arcsec. Further, only (0002) and (0004) planes of AlN were observed when performing an X-ray diffraction measurement of θ-2θ mode. Further, the photo luminescence measurement at room temperature (23° C.) was performed; and as a result, a peak around 209 nm, which is the band edge emission light of AlN, was confirmed.

TABLE 1

| | Suceptor Material | Screw Material | Temp. ° C. | Thickness μm | Linear Transparency % | Absorption Number $cm^{-1}$ | C $cm^{-3}$ | O $cm^{-3}$ | Si $cm^{-3}$ | B $cm^{-3}$ | Cl $cm^{-3}$ | Total Content $cm^{-3}$ | Full Width at Half Maximum arcsec |
|---|---|---|---|---|---|---|---|---|---|---|---|---|---|
| Ex. 1 | BN/Graphite | BN/Graphite | 1450 | 200 | 70 | 18 | 1.E+17 | 3.E+17 | 1.E+17 | 5.E+15 | 1.E+15 | 5.1E+17 | 1200 |
| Ex. 2 | BN/Graphite | Tangsten | 1350 | 200 | 58 | 27 | 3.E+16 | 5.E+17 | 3.E+17 | 3.E+15 | 5.E+15 | 8.4E+17 | 1800 |
| Ex. 3 | BN/Graphite | TaC | 1250 | 200 | 45 | 40 | 3.E+16 | 1.E+17 | 4.E+17 | 1.E+14 | 7.E+14 | 5.3E+17 | 2800 |
| Comp. Ex. 1 | BN/Graphite | Graphite | 1550 | 200 | 38 | 48 | 7.E+17 | 5.E+16 | 3.E+17 | 1.E+15 | 4.E+14 | 1.1E+18 | 1000 |
| Comp. Ex. 2 | BN/Graphite (with pinholes) | Graphite | 1450 | 200 | 17 | 90 | 4.E+18 | 5.E+16 | 4.E+16 | 1.E+15 | 4.E+15 | 4.1E+18 | 1250 |

TABLE 1-continued

| | Suceptor Material | Screw Material | Temp. °C | Thickness μm | Linear Transparency % | Absorption Number cm$^{-1}$ | C cm$^{-3}$ | O cm$^{-3}$ | Si cm$^{-3}$ | B cm$^{-3}$ | Cl cm$^{-3}$ | Total Content cm$^{-3}$ | Full Width at Half Maximum arcsec |
|---|---|---|---|---|---|---|---|---|---|---|---|---|---|
| Comp. Ex. 3 | SiC | TaC | 1450 | 150 | 0.1 | 435 | 1.E+19 | 5.E+17 | 5.E+17 | 3.E+15 | 8.E+14 | 1.1E+19 | 2500 |
| Comp. Ex. 4 | Graphite/Sapphire | Graphite | 1490 | 200 | 6 | 141 | 6.E+17 | 2.E+20 | 5.E+18 | 5.E+15 | 8.E+16 | 2.1E+20 | 5300 |

The invention claimed is:

1. A single-crystalline aluminum nitride, comprising: a single-crystalline aluminum nitride having a predetermined amount of carbon and chlorine impurities, wherein:
a carbon concentration is $1\times10^{14}$ atoms/cm$^3$ or more and less than $3\times10^{17}$ atoms/cm$^3$,
a chlorine concentration is $1\times10^{14}$ to $1\times10^{17}$ atoms/cm$^3$, and
an absorption coefficient at 265 nm wavelength is 40 cm$^{-1}$ or less.

2. The single-crystalline aluminum nitride as set forth in claim 1, wherein a total concentration of carbon, chlorine, boron, silicon and oxygen in the single-crystalline aluminum nitride is $1\times10^{15}$ to $1\times10^{20}$ atoms/cm$^3$.

3. The single-crystalline aluminum nitride as set forth in claim 1, wherein a full width at half maximum of an X-ray rocking curve for (0002) plane of the single-crystalline aluminum nitride is 3,000 arcsec. or less.

4. The single-crystalline aluminum nitride as set forth in claim 1, wherein a 209 nm peak, which is a band edge emission light of the aluminum nitride, can be confirmed by a photo luminescence measurement.

5. A manufacturing method of the single-crystalline aluminum nitride as set forth in claim 1 by growing the single-crystalline aluminum nitride on a single crystalline substrate by a hydride vapor phase epitaxy method, with supplying an aluminum trichloride gas,
wherein the single-crystalline aluminum nitride is grown on the substrate at a temperature of 1200° C. or more to 1700° C. or less; and
an exposed surface in the hydride vapor phase epitaxy apparatus, which becomes 1200° C. or more when growing crystals, consists of a component made of a material which does not cause a reduction decomposition or a thermal decomposition at a temperature of 1200° C. or more to 1700° C. or less, or a material which does not generate gas including carbon atoms even when the material causes the reduction decomposition or the thermal decomposition.

6. The manufacturing method as set forth in claim 5, wherein the exposed surface in the hydride vapor phase epitaxy apparatus, which becomes 1200° C. or more, is made of at least one kind selected from a group consisting of BN, TaC, W and Mo.

7. The single-crystalline aluminum nitride as set forth in claim 1, wherein single-crystalline aluminum nitride has a thickness of 50 μm to 2000 μm.

8. The single-crystalline aluminum nitride as set forth in claim 1, wherein single-crystalline aluminum nitride has a thickness of 200 μm to 2000μm.

9. The single-crystalline aluminum nitride as set forth in claim 1, wherein single-crystalline aluminum nitride has a carbon concentration of $1\times10^{14}$ atoms/cm$^3$ to $1\times10^{15}$ atoms/cm$^3$.

10. A manufacturing method of the single-crystalline aluminum nitride as set forth in claim 1, comprising:
supplying an aluminum trichloride gas and ammonia gas to a hydride vapor phase epitaxy apparatus comprising a single crystalline substrate and a support stand for the single crystalline substrate; and
growing a single-crystalline aluminum nitride on the single crystalline substrate by a hydride vapor phase epitaxy method at a temperature of 1200° C. to 1700° C.,
wherein the support stand comprises a carbon non-generating material.

11. The method as set forth in claim 10, wherein the support stand comprises a material selected from the group consisting of BN, TaC, W and Mo.

12. The method as set forth in claim 10, wherein the support stand comprises a graphite material.

13. The method as set forth in claim 12, wherein the graphite material is coated with TaC.

14. The method as set forth in claim 12, wherein the graphite material is coated with BN.

15. The method as set forth in claim 10, wherein single-crystalline aluminum nitride has a thickness of 200μm to 2000 μm.

16. The method as set forth in claim 10, wherein single-crystalline aluminum nitride has a carbon concentration of $1\times10^{14}$ atoms/cm$^3$ to $1\times10^{15}$ atoms/cm$^3$.

* * * * *